US00RE33941E

United States Patent [19]

Lorincz et al.

[11] E Patent Number: Re. 33,941

[45] Reissued Date of Patent: May 26, 1992

[54] POWER DRIVER HAVING SHORT CIRCUIT PROTECTION

[75] Inventors: Stefan Lorincz, Arlington Heights, Ill.; Jeffrey J. Braun, Mesa, Ariz.

[73] Assignee: Motorola, Inc., Schaumburg, Ill.

[21] Appl. No.: 499,845

[22] Filed: Mar. 27, 1990

Related U.S. Patent Documents

Reissue of:

[64] Patent No.: 4,771,357
Issued: Sep. 13, 1988
Appl. No.: 890,259
Filed: Jul. 23, 1986

[51] Int. Cl.[5] ..... H02H 3/26

[52] U.S. Cl. ..... 361/87; 323/278; 323/279; 323/289; 323/351; 361/93; 361/98

[58] Field of Search ..... 361/87, 93, 98; 323/278, 279, 289, 351

[56] References Cited

U.S. PATENT DOCUMENTS

| | | | |
|---|---|---|---|
| 3,311,787 | 3/1967 | Gunderman . | |
| 3,906,310 | 9/1975 | Esashika | 323/278 |
| 3,959,713 | 5/1976 | Davis et al. | 323/278 |
| 4,268,887 | 5/1981 | Ghiringelli et al. | 361/93 |
| 4,278,930 | 7/1981 | Rogers | 361/93 |
| 4,348,709 | 9/1982 | Mauk et al. | 361/93 |
| 4,371,824 | 2/1983 | Gritter | 361/18 |
| 4,390,828 | 6/1983 | Converse | 323/278 |
| 4,393,431 | 7/1983 | Gilker | 361/93 |
| 4,404,473 | 9/1983 | Fox | 361/93 |
| 4,423,457 | 12/1983 | Brajder | 361/98 |
| 4,495,537 | 1/1985 | Laude | 361/98 |
| 4,509,102 | 4/1985 | Ayer | 361/93 |

*Primary Examiner*—Jeffrey A. Gaffin
*Attorney, Agent, or Firm*—John H. Moore

[57] ABSTRACT

A power driver including a switch (17) that connects between a power input terminal (12) and a power output terminal (13). A current sense unit (22) provides an over current sense signal if an over current condition should exist with respect to the switch (17). A reference signal unit (23) utilizes a control signal as introduced at a control signal input (11) to provide a threshold current level signal. A comparator (21) compares the latter two signals and provides an enabling signal to a second switch (19) to disable the switch (17) upon detecting an over current condition. The comparator (21) is enabled by the control signal.

17 Claims, 2 Drawing Sheets

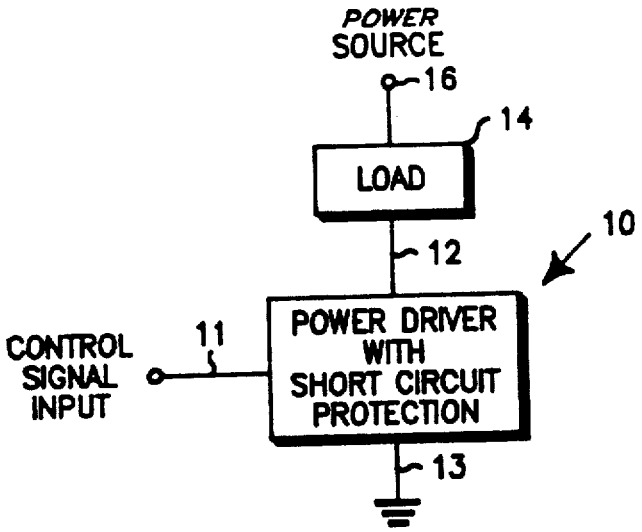
Fig. 1
Fig. 2
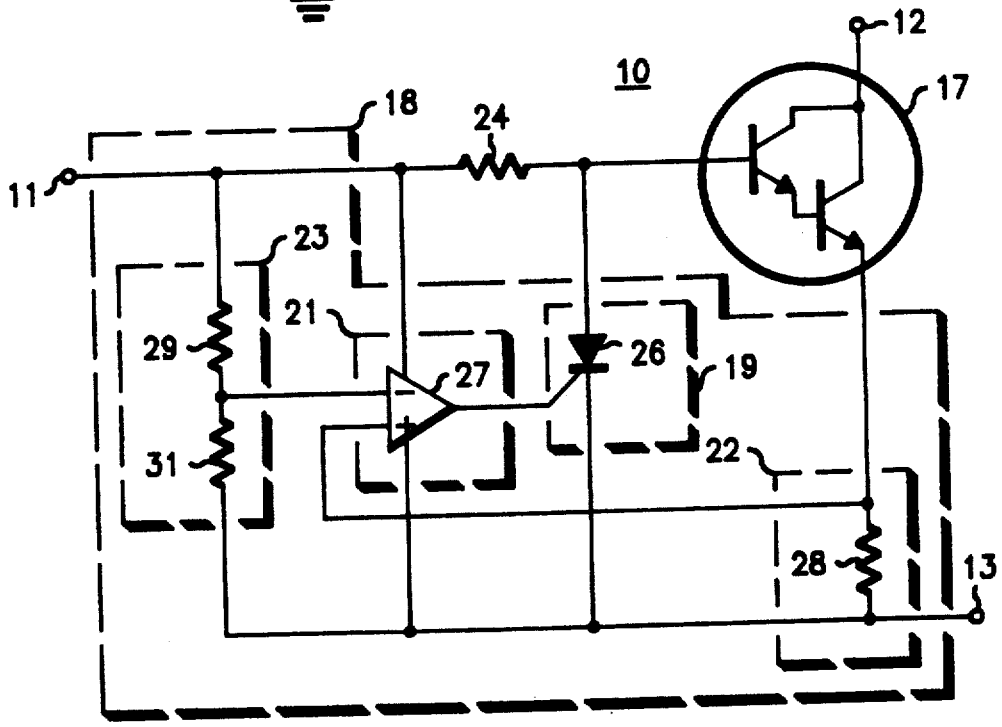
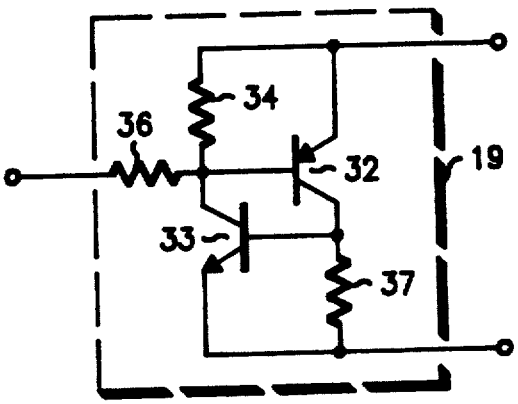
Fig. 3

POWER DRIVER HAVING SHORT CIRCUIT PROTECTION

Matter enclosed in heavy brackets [ ] appears in the original patent but forms no part of this reissue specification; matter printed in italics indicates the additions made by reissue.

TECHNICAL FIELD

This invention relates generally to short circuit protection schemes, and particularly to implementation of short circuit protection in a low side power driver circuit.

BACKGROUND ART

Many electronic circuits function, at least in part, to provide power to a load to thereby effectuate some intended purpose. In general, such driver circuits include a switch (such as a transistor) that can be operated to make or break a current path that includes the load and a power source.

In many such applications, short circuit conditions can accidentally occur. When this happens, the driver circuit switch may be damaged due to excessive current flow. Therefore, various prior art approaches have been propsed to attempt to avoid or minimize the risk of such damage.

Depending upon the application, such prior art approaches may be undesirable or unacceptable due to functioning characteristics, complexity, cost, or response capabilities. There therefore exists a need for short circuit protection in a power driver that will respond quickly to fault conditions and protect the switch in a relatively simple and cost effective manner. It would also be desirable if such a device could be offered in integrated form in a 3 pin package.

SUMMARY OF THE INVENTION

These needs and others are substantially met through provision of the power driver having short circuit protection disclosed in this specification. The device includes generally no more than three input/output terminals, including a control signal input for receiving a control signal, a power input, and a power output. The device further includes a switch connected in series between the power input and the power output, this switch being responsive to the control signal to selectively connect the power input to the power output when desired. Further, the device includes an over current detection unit for detecting a level of current through the switch that exceeds a threshold current level. Upon detecting such excessive current flow, the over current detection unit causes the switch to disconnect the power input and power output. To accomplish this, a comparator compares a first signal that relates to the level of current flowing through the switch against a second signal that relates to the threshold current level. Importantly, the second signal can be formed as a function of the control signal, and the control signal can further function to enable the comparator.

To satisfy the various needs noted above, the input control signal serves a number of functions. As indicated above, this signal functions under ordinary circumstances, to enable both the switch and the comparator, and aids in establishing a comparator reference signal. Due in part to this unique multiple use of the control signal, a three lead device can be offered having only a control signal input, a power in, and a power out terminal that provides reliable and cost effective short circuit protection, particularly if offered in an integrated circuit package.

BRIEF DESCRIPTION OF THE DRAWINGS

These and other attributes of the invention will become more clear upon making a thorough review and study of the following description of the best mode for carrying out the invention, particularly when reviewed in conjunction with the drawings, wherein:

FIG. 1 comprises a block diagram view of the device as configurated in an application setting;

FIG. 2 comprises a schematic diagram of a first embodiment;

FIG. 3 comprises a schematic diagram of a second embodiment;

BEST MODE FOR CARRYING OUT THE INVENTION

Figure 4:
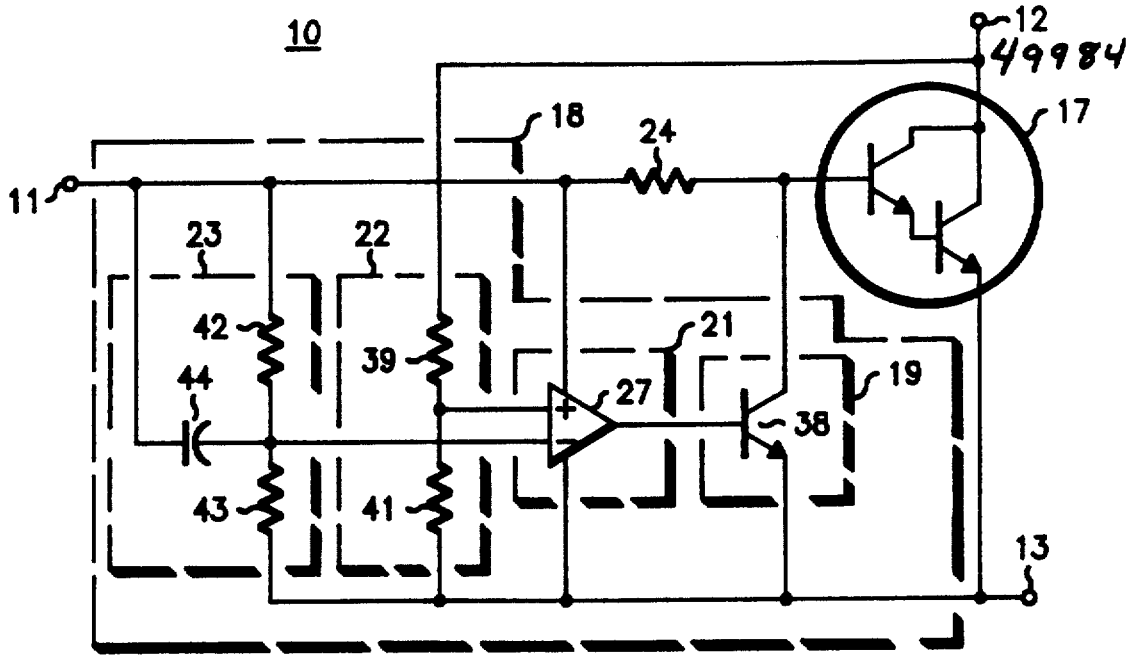
FIG. 4 comprises a schematic diagram of a third embodiment.

Referring now to the drawings, and in particular to FIG. 1, the device can be seen as depicted generally by the numeral 10. The device (10) includes three input/output terminals; a control signal output (11), a power input (12), and a power output (13). The control signal input (11) can be connected to receive an appropriate control signal. The power input (12) can connect to a series configured load (14) and power source (16). The power output (13) connects to ground.

Various embodiments of the device (10) will now be described in more detail in seriatim fashion.

Referring now to FIG. 2, a first embodiment of the device (10) includes generally a switch (17) and an over current detection unit (18). The over current detection unit (18) includes generally a second switch (19), a comparator (21), a current sensing unit (22) and a reference signal unit (23).

The switch (17) can be comprised of an appropriate power transistor, the collector of which comprises the power input (12) and the emitter of which connects to the current sense unit (22) as described in more detail below. The base of this transistor connects through an appropriate resistor (24) to the control signal input (11).

The second switch (19) can be comprised of an SCR (26), the anode of which connects to the base of the power transistor (17) and the cathode to the base of the power transistor (17) and the cathode of which connects to the power output terminal (13). The gate for this SCR (26) connects to the comparator (21) as described below.

The comparator (21) can be comprised of an operational amplifier (27). The output of this operational amplifier (27) connects to the gate of the second switch SCR (26). The noninverting input of the operational amplifier (27) connects to the current sense unit (22) and the inverting input connects to the reference signal unit (23) as described below in more detail. Importantly, the ground pin for the operational amplifier (27) connects to the power output terminal (13) and the biasing voltage pin connects to the control signal input (11). So configured, the control signal provided at the control signal input (11) will serve to bias the operational amplifier (27) into an enabled state.

The current sense unit (22) can be comprised of a resistor (28) that connects in series between the switch (17) and the power output terminal (13). The high side of the resistor (28) connects to the noninverting input of the comparator operation amplifier (27) as referred to above.

The reference signal unit (23) includes a voltage divider comprised of two resistors (29 and 31). These resistors (29 and 31) connect in series between the control signal input (11) and the power output terminal (13). The node between these two resistors (29 and 31) connects to the inverting input of the comparator operational amplifier (27). So configured, the control signal as received at the control signal input (11) will provide a bias signal that, through operation of the voltage divider, will provide a reference signal to the inverting input of the operational amplifier (27) that represents a threshold current level.

During normal operation, presence of a control signal at the control signal input (11) will serve three functions. First, the control signal will bias the switch (17) into a conductive state, thereby allowing current to flow from the power source and load therethrough to complete a current flow path. Second, the control signal will power up and thereby enable the comparator operational amplifier (27) to thereby allow the comparator (21) to monitor for an over current condition. Third, the control signal will bias the reference signal unit (23) to thereby yield a threshold reference signal for use by the comparator (21).

When an over current condition exists, current through the sense resistor (28) will rise and increase the voltage at the noninverting input of the comparator operational amplifier (27). When this current sense signal exceeds the threshold signal provided by the reference signal unit (23), the comparator (21) will provide a high signal that will trigger the SCR (26) and thereby divert the control signal from the base of the switch transistor (17) to ground and thereby disable the switch (17).

Referring now to FIG. 3, a second embodiment of the device will be described.

In this second embodiment, all of the components as described above with respect to the first embodiment remain the same with the exception of the second switch (19). In this embodiment, the second switch can be comprised of a PNP transistor (32), a NPN transistor (33), and three resistors (34, 36, and 37). The output of the comparator (21) (FIG. 2) connects through one resistor (36) to the base of the PNP transistor (32) and the collector of the NPN transistor (33). The base of the PNP transistor (32) connects through another resistor (34) to the emitter thereof, and also to the base of the switch power transistor (FIG. 2). The collector of the PNP transistor (32) connects to the base of the NPN transistor (33) and through the third resistor (37) to the emitter thereof. Finally, the emitter of the NPN transistor (33) connects to the power output terminal (13) (FIG. 2).

So configured, the above described transistor latch will operate to connect the base of the switch power transistor to the power output terminal (13) upon receipt of an enabling signal from the comparator (21).

Referring now to FIG. 4, a third embodiment of the device (10) will now be described.

In this embodiment, the control signal input (11) again connects through a resistor (24) to the base of a switch power transistor, the collector of which comprises the power input terminal (12). In this case, however, the emitter of the switch power transistor connects directly to the power output terminal (13).

The over current detection unit (18) again includes a second switch (19), a comparator (21), a current sense unit (22), and a reference signal unit (23). In this third embodiment, the comparator (21) can again be comprises of an operational amplifier (27) having its biasing pin connected to the control signal input (11) and its ground pin connected to the power output terminal (13). The remaining elements, however, include differences from the embodiments described above, which differences will now be set forth.

The second siwtch (19) can be comprised of an NPN transistor (38), the base of which connects to the output of the comparator operational amplifier (27), the collector of which connects to the base of the switch power transistor (17), and the emitter of which connects to the power output terminal (13).

The current sense unit (22) includes a voltage divider network comprised of two resistors (39 and 41). The noninverting input of the operational amplifier (27) connects through one of these resistors (41) to the power output terminal (13) and through the remaining resistor (39) to the power input terminal (12). So configured, the current sense unit (12) monitors the collector saturation voltage of the switch power transistor.

The reference signal unit (23) includes a voltage divider network comprised of two resistors (42 and 43) and a capacitor (44). The capacitor (44) and one resistor (42) are connected in parallel between the control signal input (11) and the inverting input of the operational amplifier (27). The remaining resistor (43) connects between the inverting input of the operational amplifier (27) and the power output terminal (13).

So configured, the reference signal unit (23) will operate to effectively provide an initially higher reference signal to the comparator (21), followed by a lower threshold signal once the capacitor (44) has fully charged. This bifurcated reference signal structure ensures that the comparator (21) will provide an appropriate initial nonenabling signal to the second switch transistor (38). In this way, the second switch (19) can be made responsive to only a true over current condition and not merely to initial start up conditions.

Figure 5:
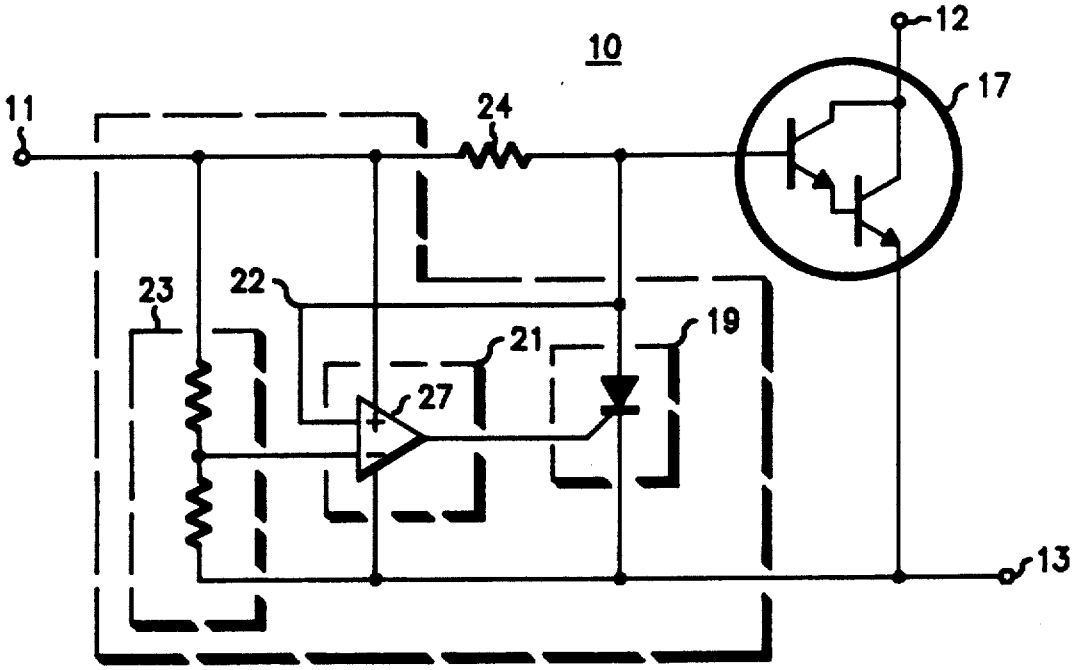
FIG. 5 comprises a schematic diagram of a fourth embodiment.

Referring now to FIG. 5, a fourth embodiment of the invention will be described.

In this embodiment, the reference signal unit (23) connects to the inverting input of the comparator operational amplifier (27). The current sense unit (22) in this case comprises a conductive path between the base of the switch power transistor (17) and the noninverting input of the operational amplifier (27). So configured, the comparator (21) will monitor the base emitter voltage of the switch power transistor (17).

The device (10) described through various embodiments set forth above provides a three terminal device that provides power to a load in response to receipt of a control signal, and simultaneously utilizes that control signal to establish an over current reference signal and to enable an over current detection mechanism. Few parts are required, and a generally cost effective yet reliable short circuit protection system results.

Those skilled in the art will appreciate that various modifications of the device (10) could be made without departing from the scope of the inventive concept set forth. Therefore, it should be understood that the claims should not be viewed as being limited to the precise embodiments set forth in the absence of limitations clearly directed to such embodiments.

We claim:

1. A power driver having short circuit protection comprising:

(a) three input/output terminals, wherein:

(i) one of said terminals comprises a power input;

(ii) another of said terminals comprises a power output; and (iii) another of said terminals comprises a control signal input that receives a control signal, which control signal is unrelated to said power input;

(b) a switch having power terminals connected in series with said power output and said power input, said switch being enabled by said control signal to connect said power input to said power output; and (c) over current detection means for detecting a level of current through said switch in excess of a threshold current level and for causing said switch to disconnect said power input from said power output upon detecting such an excessive level of current, said over current detection means including comparator means for comparing a first signal that relates to said level of current flowing through said switch against a second signal that relates to said threshold current level, wherein said second signal is formed as a function of said control signal, and said comparator means is enabled by said control signal.

2. The power driver having short circuit protection of claim 1 wherein said over current detection means includes a second switch responsive to said comparator means that prevents said control signal from enabling said switch.

3. The power driver having short circuit protection of claim 2 wherein said second switch comprises an SCR.

4. The power driver having short circuit protection of claim 2 wherein said second switch comprises a transistor latch.

5. The power driver having short circuit protection of claim 1 wherein said first signal is provided by a current sense resistor located in series with said power input and said power output.

6. The power driver having short circuit protection of claim 5 wherein said current sense resistor connects between said switch and said power output.

7. The power driver having short circuit protection of claim 1 wherein said over current detection means includes a voltage divider to provide said second signal.

8. The power driver having short circuit protection of claim 7 wherein said voltage divider connects between said control signal input and said power output.

9. The power driver having short circuit protection of claim 1 wherein said switch comprises a transistor having a base that connects to allow said transistor to respond to said control signal.

10. The power driver having short circuit protection of claim 9 wherein said second signal relates to base emitter voltage for said transistor.

11. The power driver having short circuit protection of claim 9 wherein said second signal relates to collector saturation voltage for said transistor.

12. The power driver having short circuit protection of claim 11 wherein said over current detection means includes reference signal means that provides said second signal, wherein said reference signal means includes timing means that provides an initially higher threshold current level upon initially providing said control signal to said control signal input.

13. The power driver having short circuit protection of claim 12 wherein said timing means includes a voltage divider and a capacitor.

14. A power driver having short circuit protection comprising:

(a) three input/output terminals, wherein:

(i) one of said terminals comprises a power input;

(ii) another of said terminals comprises a power output; and (iii) another of said terminals comprises a control signal input that receives a control signal, which control signal is unrelated to said power input;

(b) a transistor switch having power terminals connected in series with said power input and said power output, said transistor switch having a base connected to be responsive to said control signal;

(c) over current detection means for detecting a level of current through said transistor switch in excess of a threshold current level and for causing said transistor switch to disconnect said power input from said power output upon detecting such an excessive level of current, said over current detection means comprising:

(i) current sense means comprising a sense resistor connected in series with said power input and said power output for providing a current sense signal;

(ii) reference signal means comprising a voltage divider that receives said control signal and that divides said control signal down to a reference signal representing a threshold current level;

(iii) comparator means for receiving said current sense signal and said reference signal and for providing an enabling signal when said current sense signal exceeds said reference signal, wherein said comparator means are enabled by said control signal; and (iv) second switch means responsive to said enabling signal from said comparator means to divert said control signal away from said base of said transistor switch to thereby disable said transistor switch when an over current condition has been sensed.

15. A power driver having short circuit protection comprising:

(a) three input/output terminals, wherein:

(i) one of said terminals comprises a power input;

(ii) another of said terminals comprises a power output; and (iii) another of said terminals comprises a control signal input that receives a control signal, which control signal is unrelated to said power input;

(b) a transistor switch having power terminals connected in series with said power input and said power output, said transistor switch having a base connected to be responsive to said control signal;

(c) over current detection means for detecting a level of current through said transistor switch in excess of a threshold current level and for causing said transistor switch to disconnect said power input from said power output upon detecting such an excessive level of current, said over current detection means comprising:

(i) an over current sense unit comprising a voltage divider biased by collector saturation voltage for said transistor switch such that said over current sense unit provides an over current sense signal;

(ii) reference signal means for providing a threshold currrent level signal, said reference signal means including a voltage divider that divides down said control signal input to provide said threshold current level signal, and a capacitor that initially causes said threshold current level signal, when said control signal is initially applied to said control signal input, to substantially equal a larger threshold current level signal;

(iii) comparator means for receiving said over current sense signal and said threshold current level signal and for providing an enabling output signal when said over current sense signal exceeds said threshold current level signal, wherein said comparator means are enabled by said control signal; and (iv) second switch means responsive to said enabling signal from said comparator means for diverting said control signal away from said transistor switch to thereby disable said transistor switch when an over currnet condition has been sensed.

16. A power driver having short circuit protection comprising:

(a) three input/output terminals, wherein:

(i) one of said terminals comprises a power input;

(ii) another of said terminals comprises a power output; and (iii) another of said terminals comprises a control signal input that receives a control signal, which control signal is unrelated to said power input;

(b) a transistor switch having power terminals connected in series with said power input and said power output, said transistor switch having a base connected to be responsive to said control signal;

(c) over current detection means for detecting a level of current through said transistor switch in excess of a threshold current level and for causing said transistor switch to disconnect said power input from said power output upon detecting such an excessive level of current, said over current detection means comprising:

(i) over current sense means comprising a conductive path connected to the base of said transistor switch for providing an over current sense signal;

(ii) reference signal means comprising a voltage divider for dividing down said control signal to a threshold current level signal;

(iii) comparator means for receiving said over current sense signal and said threshold current level signal and for providing an enabling signal when said over current sense signal exceeds said threshold current level signal, wherein said comparator means are enabled by said control signal; and (iv) second switch means responsive to said enabling signal from said comparator means for diverting said control signal from said base of said transistor switch to thereby disable said transistor switch in response to sensing an over current condition.

*17. A power driver having short circuit protection comprising:*

*(a) three input/output terminals, wherein:*

*(i) one of said terminals comprises a power input;*

*(ii) another of said terminals comprises a power output; and*

*(iii) another of said terminals comprises a control signal input that receives a control signal, which control signal is unrelated to said power input;*

*(b) a switch having power terminals connected in series with said power output and said power input, said switch being enabled by said control signal to connect said power input to said power output; and*

*(c) over current detection means, including means generating a first signal that relates to said level of current flowing through said switch, means for generating a second signal that relates to a threshold current level, and disconnect means responsive to said first signal exceeding the second signal for disconnecting said power input from said power output, said second signal and said disconnect means being enabled by said control signal.*

* * * * *